(12) United States Patent
Ba-Tis

(10) Patent No.: US 10,965,848 B1
(45) Date of Patent: Mar. 30, 2021

(54) MEMS ELECTROSTATIC ACTUATOR FOR SUPER RESOLUTION AND AUTOFOCUS IN CAMERAS

(71) Applicant: Sheba Microsystems Inc., Toronto (CA)

(72) Inventor: Faez Ba-Tis, Toronto (CA)

(*) Notice: Subject to any disclaimer, the term of this patent is extended or adjusted under 35 U.S.C. 154(b) by 0 days.

(21) Appl. No.: 17/108,945

(22) Filed: Dec. 1, 2020

(51) Int. Cl.
*H04N 5/232* (2006.01)
*H04N 5/225* (2006.01)
*H02N 1/00* (2006.01)

(52) U.S. Cl.
CPC .......... *H04N 5/2253* (2013.01); *H02N 1/008* (2013.01); *H04N 5/2254* (2013.01); *H04N 5/23299* (2018.08)

(58) Field of Classification Search
CPC ...................................................... H02N 1/008
See application file for complete search history.

(56) References Cited

U.S. PATENT DOCUMENTS

| | | | |
|---|---|---|---|
| 9,264,591 B2 | 2/2016 | Topliss | |
| 9,578,217 B2 | 2/2017 | Gutierrez et al. | |
| 10,122,924 B2 * | 11/2018 | Ba-Tis | H04N 5/23287 |
| 10,582,100 B1 | 3/2020 | Ba-Tis et al. | |
| 2016/0165103 A1 * | 6/2016 | Topliss | H04N 5/335 |
| | | | 348/373 |

OTHER PUBLICATIONS

Ba Tis, Faez; "Three-degrees-of-freedom MEMS Electrostatic Out-of-plane Comb-drive Actuator for Auto-focus and Image Stabilization in Phone Cameras"; 2014; Mechanical and Industrial Engineering Department—University of Toronto; all pages (Year: 2014).*

* cited by examiner

*Primary Examiner* — Gary C Vieaux
(74) *Attorney, Agent, or Firm* — Nasser Ashgriz; UIPatent Inc.

(57) ABSTRACT

A MEMS electrostatic actuator that achieves autofocus and super resolution imaging in cameras is disclosed. The actuator is able to provide multi-degrees of freedom motion (of up to 5-degrees-of-freedom). It consists of a moving and fixed parts. The moving part comprises an inner and outer rotor. The inner rotor contains a load stage and the moving plates of the parallel-plate electrodes and is attached to the outer rotor via a plurality of mechanical springs. The outer rotor holds the inner rotor and contains a plurality of openings or tubes surrounded by walls and are attached to the outer periphery of the actuator via multiple mechanical springs. The present device can be used to achieve super resolution functionality in compact cameras.

18 Claims, 18 Drawing Sheets

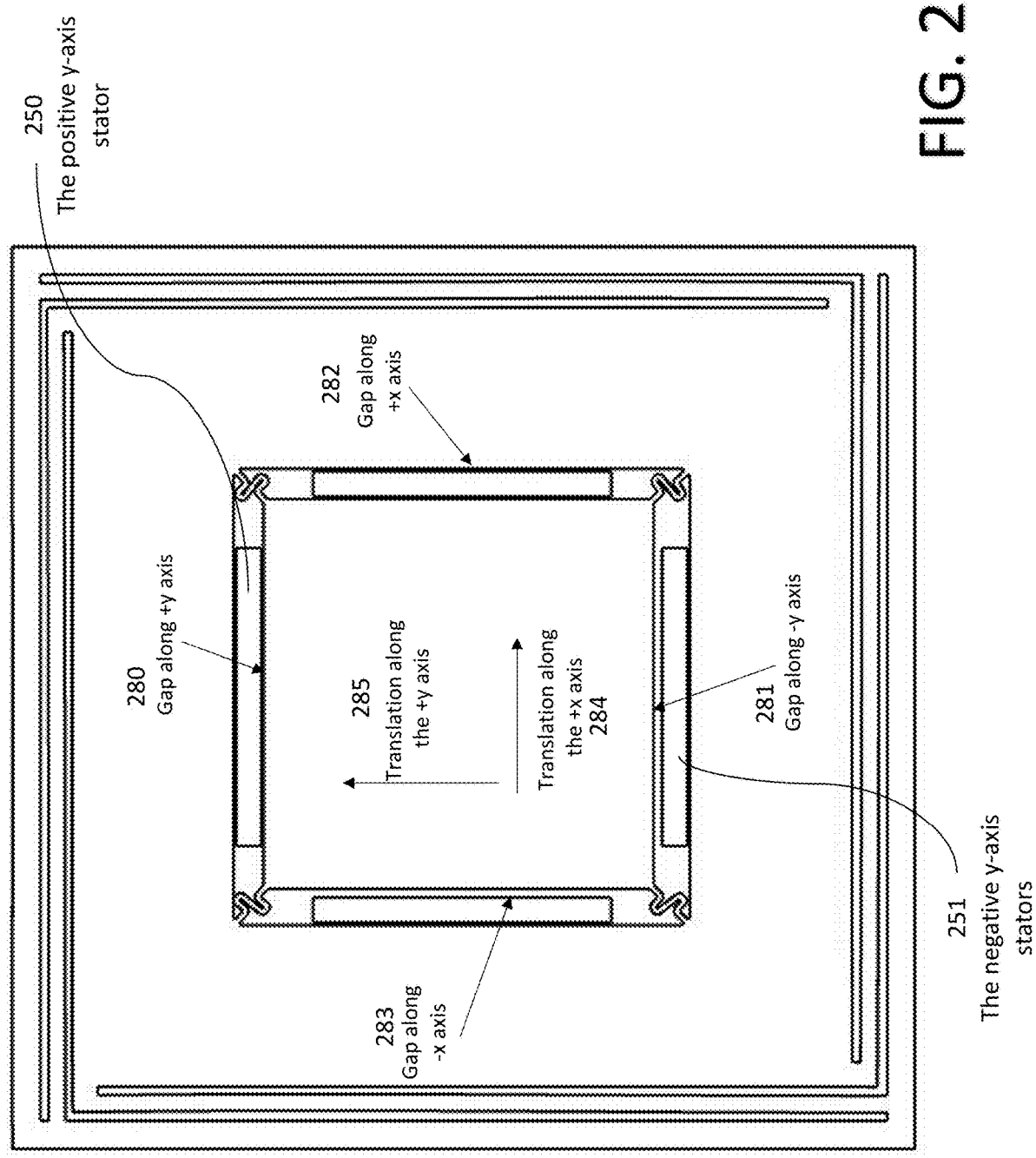

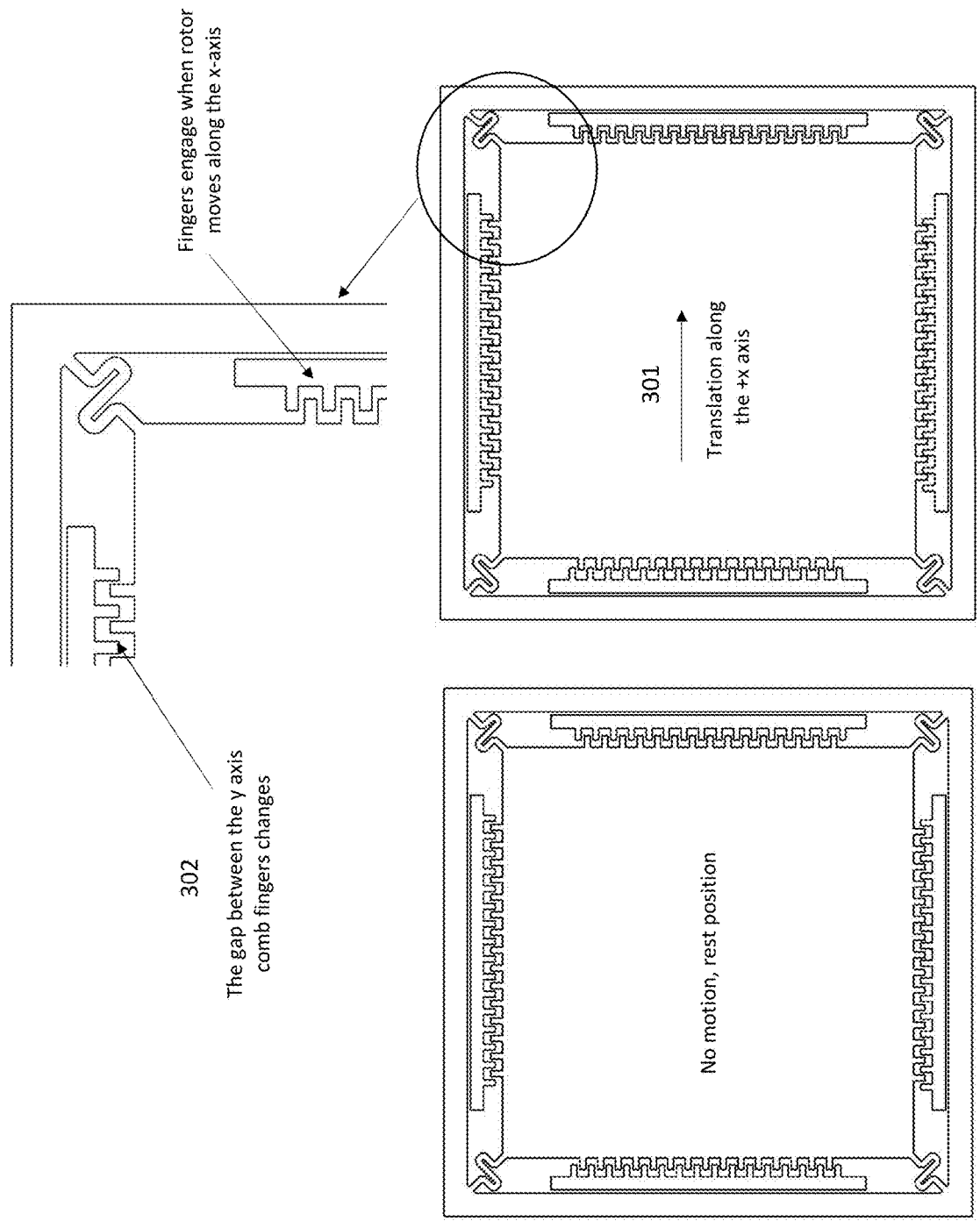

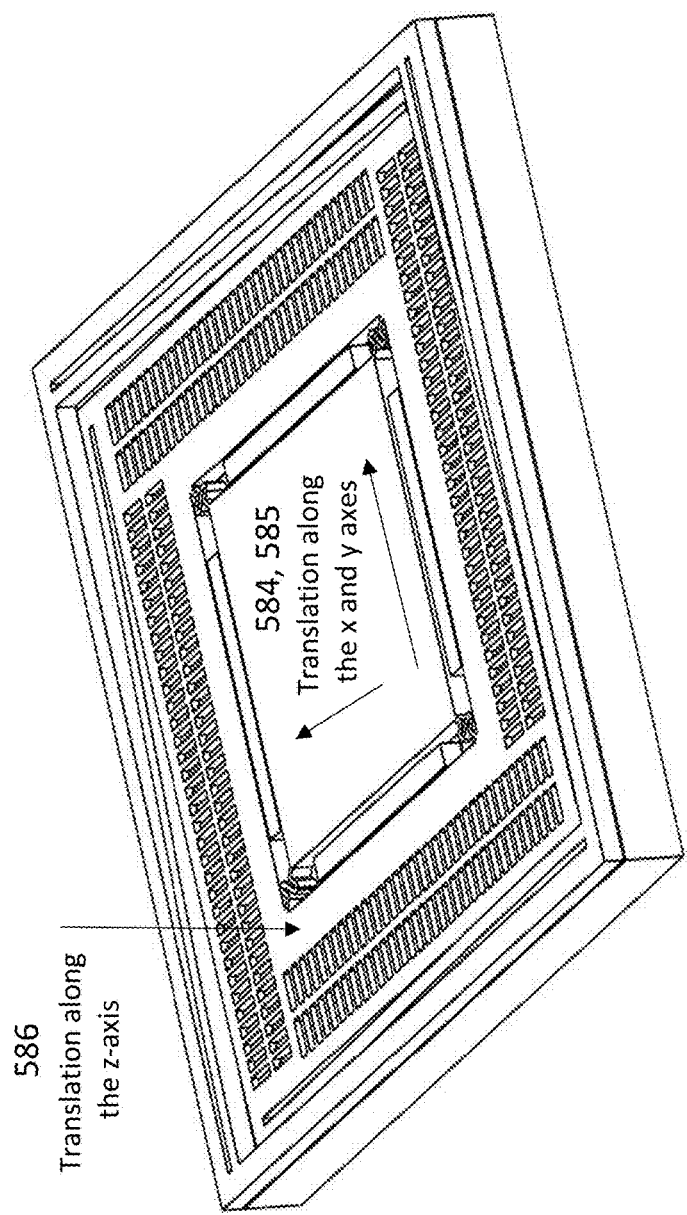
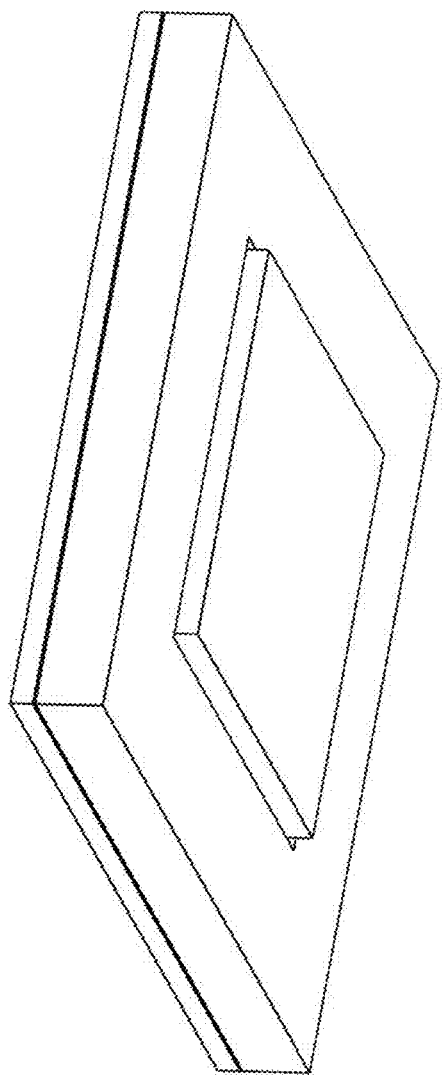
FIG. 5A
FIG. 5B

MEMS ELECTROSTATIC ACTUATOR FOR SUPER RESOLUTION AND AUTOFOCUS IN CAMERAS

FIELD OF THE INVENTION

The invention relates in general to the field of MEMS electrostatic actuators, and in particular to actuators for cameras to achieve autofocus (AF).

BACKGROUND OF THE INVENTION

Super resolution imaging requires high accuracy and high speed motion actuators, so that multiple images that are pixel-shifted with respect to each other can be processed to create higher definition images, usually double the resolution of the image sensor. The required translation stroke for the image sensor to enable super resolution imaging is in the range of the width of a sub-pixel to a single pixel (usually sub-micron to few microns) with an accuracy of 10's of nanometers. The importance of the actuator speed can be understood in view of the fact that the hand-shake motion has a frequency of about 20 Hz, which means that within 10's of milliseconds, the image frames will shift by few microns due to handshake motion. If the actuator speed is higher (settles within a millisecond), then the effect of the handshake on super resolution imaging will be significantly mitigated.

U.S. Pat. Nos. 9,264,591B2, 9,578,217B2, and 10,582,100B1 disclose image sensor MEMS actuators that provide in-plane motion along the x and y axes to mainly achieve optical image stabilization by translating the sensor along the x and y axes larger strokes to counteract the hand shake. However, the same electrostatic electrodes (in all cases comb-drive electrodes) that provide the translations are also used to provide sub-micron motion for super resolution imaging. This is very challenging since the stiffnesses of the moving parts (rotors) have to be made relatively low such that larger translational strokes are feasible to compensate for hand-shake (the required stroke range for handshake compensation is usually in the range of 70-100 microns) and thus significantly compromising the accuracy and speed of the actuator when the same electrodes are used for super resolution functionality, which usually requires a much smaller micron range motion. When the target stroke is limited to few microns, then the rotor stiffness can be made large. This makes the natural frequency of the actuator high (as actuator natural frequency can be approximated as square root of stiffness over mass). The second issue of these designs is that they all use comb-drive electrode configuration to generate the motion which has significantly less damping as opposed to the parallel plate electrode configuration which is known to have large thin film damping due to the air trapped between the large areas between the plates. This large air-damping is very important to have less overshoot in the response of the actuator and thus enables the actuator to settle fast.

The third issue in a number of these designs (U.S. Pat. No. 9,264,591B2, 957821762), is coupling across the different axes of motion and flexure mechanisms are used to reduce the coupling effects, however, these flexures do not completely eliminate the couplings as they transmit part of the motion across the moving parts of the actuators. Such coupling becomes a significant issue for the actuator accuracy if micron level motion is desired. Although the actuator presented in U.S. Pat. No. 10,582,100B1 provides totally decoupled motions by mechanically segmenting the moving parts of the actuator across all axes, the middle rotor that provides the y-axis motion holds the entire inner rotor and the inner stator. That is a significant load added to the middle rotor in addition to the image sensor load, which results in a slower response of the actuator along the y-axis. In addition, the size of the actuator is relatively large due to the decoupling between the moving parts through stators segmentation (3 stators and 3 rotors).

Therefore, there is an increasing need for a super resolution actuator that utilizes dedicated electrodes to achieve super resolution imaging so that the actuator can provide highly accurate, fast, and totally decoupled translations, while other parts of the actuator can achieve other camera functionalities like AF.

SUMMARY OF THE INVENTION

The present invention discloses a novel MEMS electrostatic microactuator that is able to provide the large translation stroke along the optical axis (z) and fine motion (sub-micron to few microns, whatever the pixel width of the image sensor) to achieve super resolution imaging features.

The present MEMS electrostatic actuator consists of two parts: moving and fixed. The moving part comprises an inner rotor (acts as a load stage) and moving plates of the x-axis parallel-plate electrodes. The inner rotor is connected to the outer rotor using mechanical springs. The outer rotor comprises a plurality of openings (tubes) that are surrounded by walls forming the outer rotor and in turn are connected to the outer periphery of the actuators via mechanical springs.

The fixed part comprises a stator base, covered by an electrically insulating layer, and a number of stators (x, y, and z stators). The x-axis stator consists of two groups of stators: positive x-axis stator and negative x-axis stator. The positive and negative x-axis stators form the fixed plates of the x-axis parallel-plate electrodes and are overlapped with the inner rotor moving plates and in the presence of a voltage input, the inner rotor undergoes bi-directional translations along the x-axis.

The y-axis stator consists of two groups of stators: positive y-axis stator and negative y-axis stator. The positive and negative y-axis stators form the fixed plates of the y-axis parallel-plate electrodes and are overlapped with the inner rotor moving plates and in the presence of a voltage input, the inner rotor undergoes bi-directional translations along the y-axis.

The z-axis stator comprises a plurality of pistons that protrude upward and are vertically aligned with the tubes in the outer rotor, and in the presence of voltage input across the outer rotor and the pistons, the outer rotor moves along the z-axis.

One of the advantageous features of the present invention is the total decoupling between the three axes of motions (3 translations). Such decoupled translations are important to have imaging systems where the autofocus feature is totally decoupled from the super resolution feature—the fine motion along the in-plane axes is used to achieve super resolution imaging while the image stays sharp in focus.

Although the parallel-plate electrode configuration is known to provide a limited motion (of up to one third of the gap between the plates where the gap size is usually in the range of up to 10 um), it provides relatively large force as opposed to a comb-drive electrode configuration which is known to generate a smaller force, but a larger stroke. Since the super resolution imaging requires a large stiffness (for faster response) and a small stroke, the parallel pate electrode is an ideal choice for this functionality.

In another embodiment of the present invention, a mechanical trench is used to provide mechanical separation between the inner x- and y-axes' stators and z axis stator. The advantage of this embodiment is that if the bi-axial tilt motions about x- and y-axes of the outer rotor are needed—for example to correct for the static or dynamic tilt between the optics and image sensor, then the actuator will provide these bi-axial tilts in the outer rotor while keeping them totally decoupled from the in-plane translations of the inner rotor.

BRIEF DESCRIPTION OF DRAWINGS

Embodiments herein will hereinafter be described in conjunction with the drawings provided to illustrate and not to limit the scope of the claims, wherein like designations denote like elements, and in which:

FIG. 1B illustrates an exploded view of FIG. 1A that shows the two wafers that the actuator is made of.

FIG. 2B is a top view illustrating the translation motion of the inner rotor along the positive directions of the x and y axes when a voltage is applied between the parallel plate electrodes of the inner rotor and the and x and y axes' stators.

FIG. 3A is a top view of a comb-drive electrode configuration when used as replacement to the parallel-plate configuration. The figure shows the inner rotor of the actuator at rest position when no voltage input is applied.

FIG. 3B is a top view of a comb-drive electrode configuration when used as a replacement to the parallel-plate electrode configuration showing the coupling between the x and y axes translations. The figure shows the parallel plate gap changes in the y axis when rotor translates along the x-axis in response to a voltage application across the inner rotor and the x-axis stator.

FIG. 5A is a top view illustrating the three translation motions of the inner and outer rotors along the x, y and z axes when a voltage is applied between the parallel plate electrodes of the inner rotor and the and x and y axes' stators and between the pistons and tubes of the outer rotor and stator.

FIG. 5B is a backside view of FIG. 5A.

DETAILED DESCRIPTION OF THE INVENTION

Figure 1A:
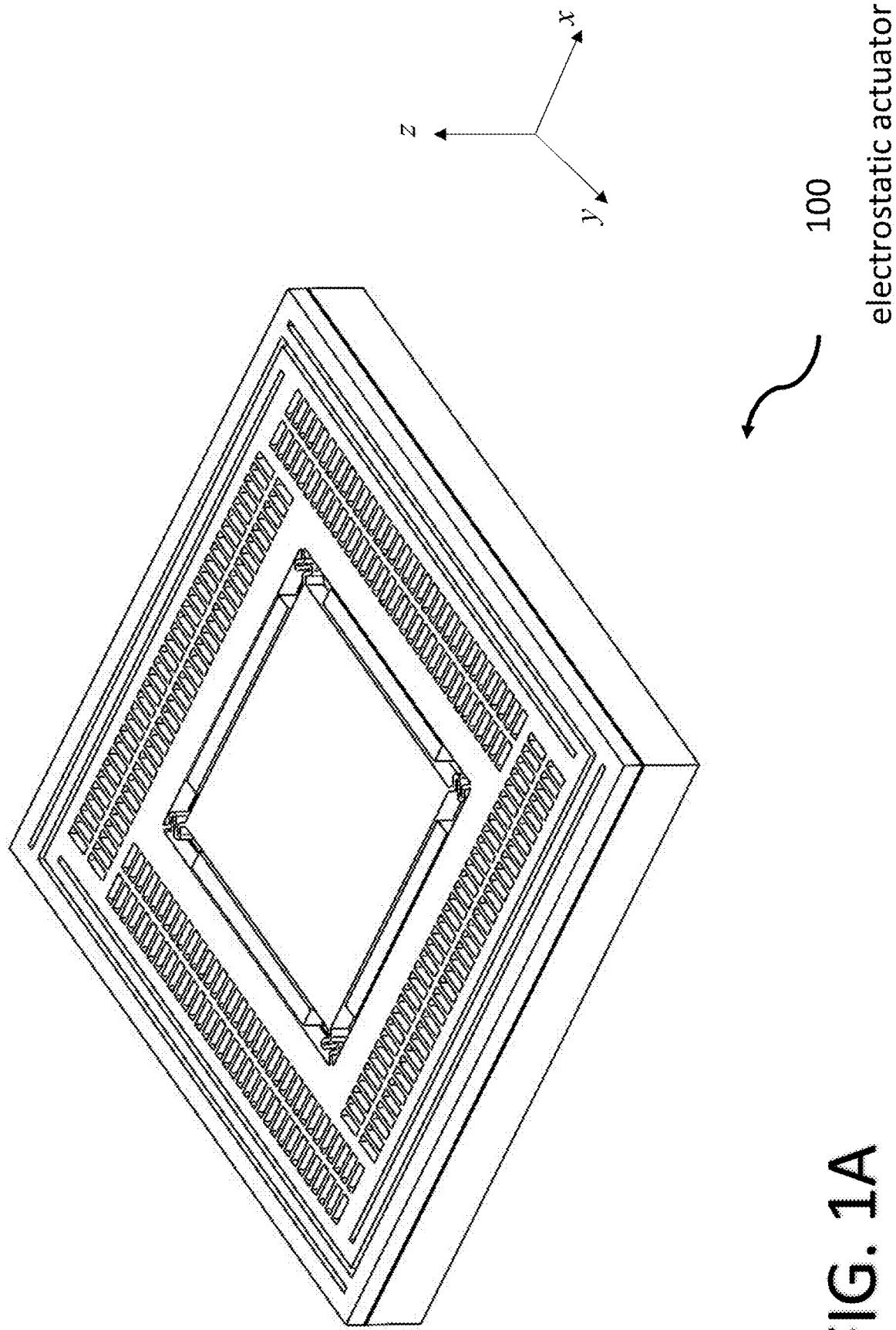
FIG. 1A shows a perspective view of the novel AF and super resolution MEMS actuator disclosed in the present invention.
Figure 1B:
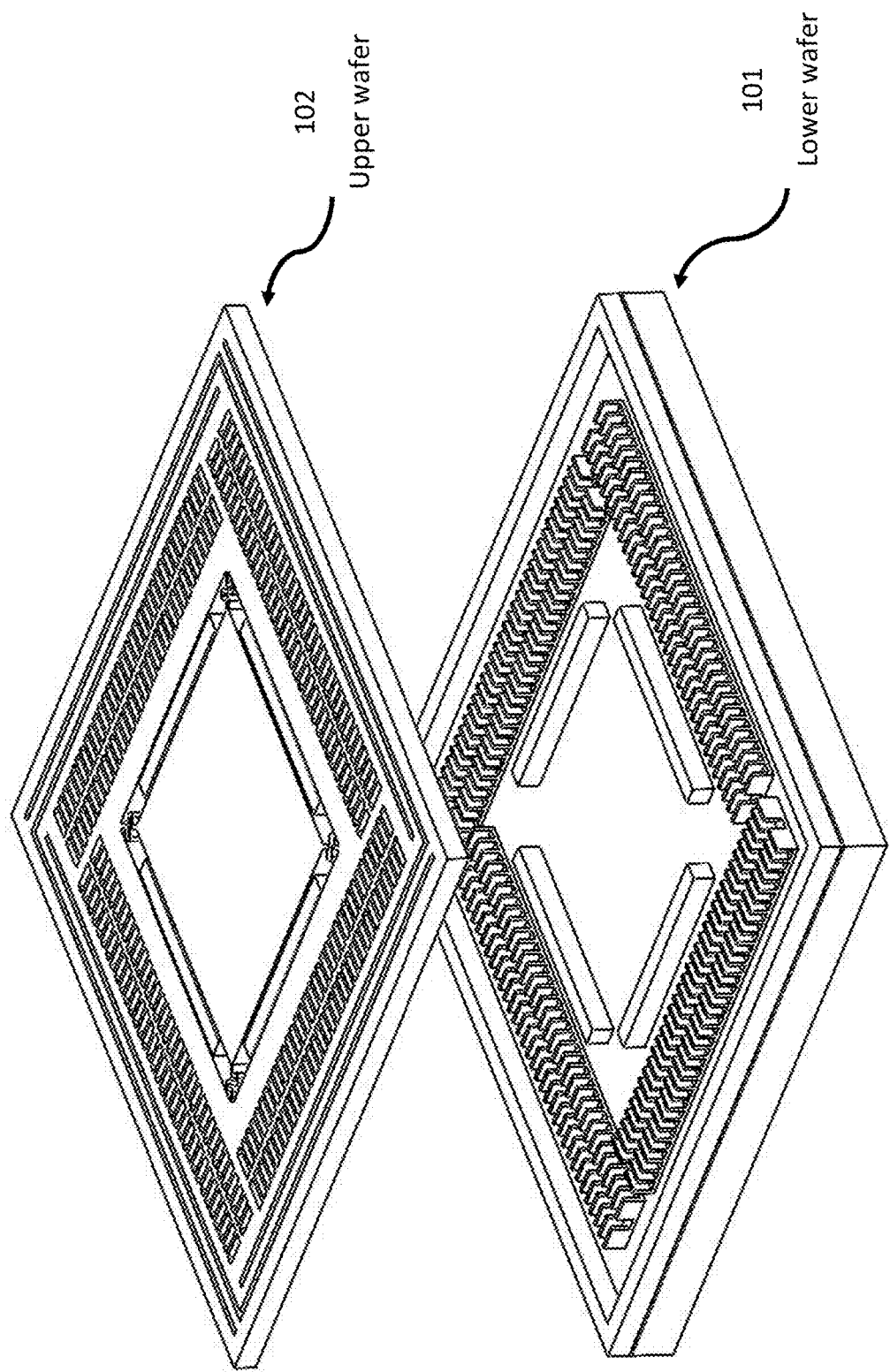
Figure 1C:
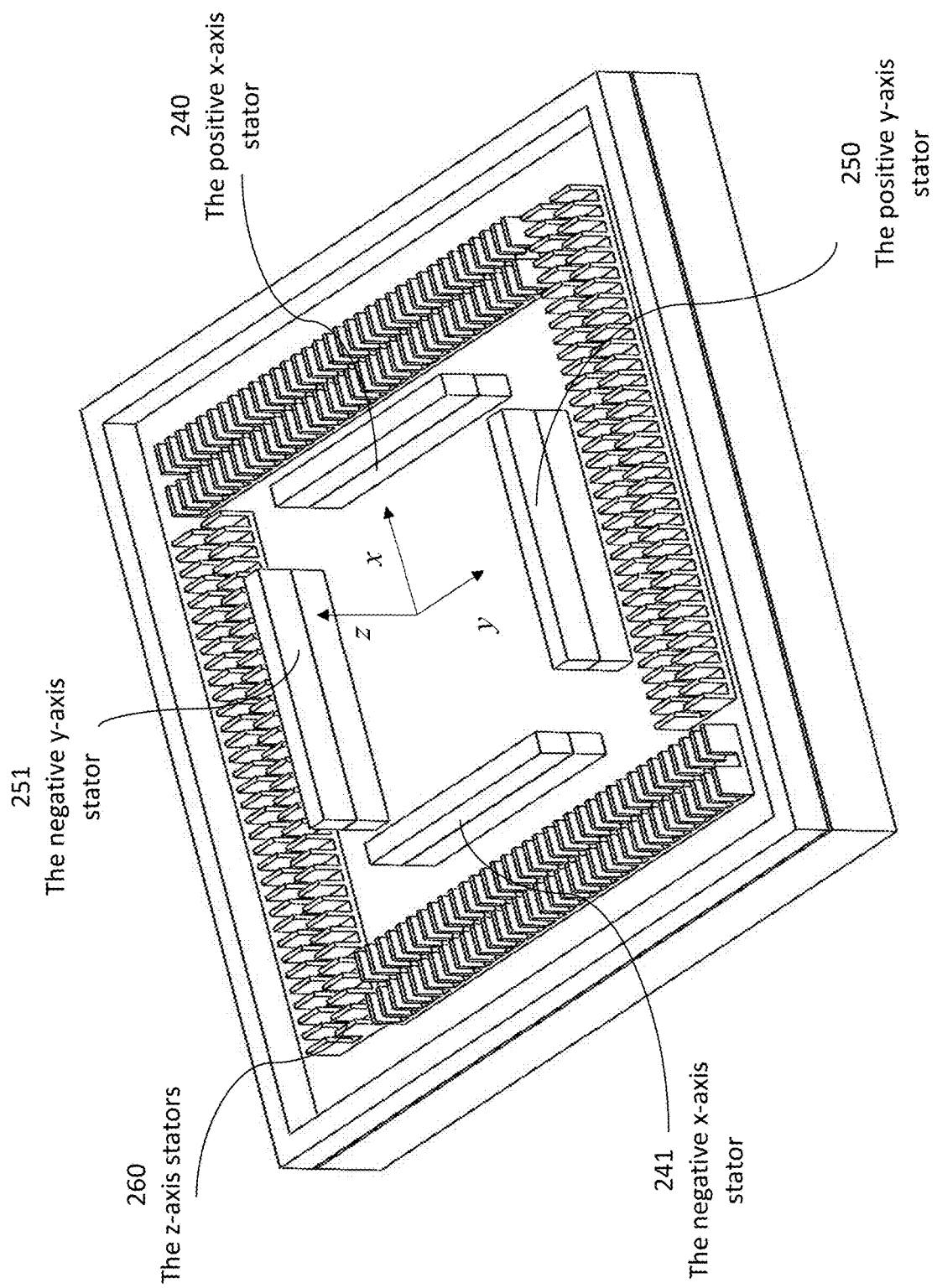
FIG. 1C illustrates a perspective view of the fixed part of the novel AF and super resolution MEMS actuator containing all the stators.
Figure 1D:
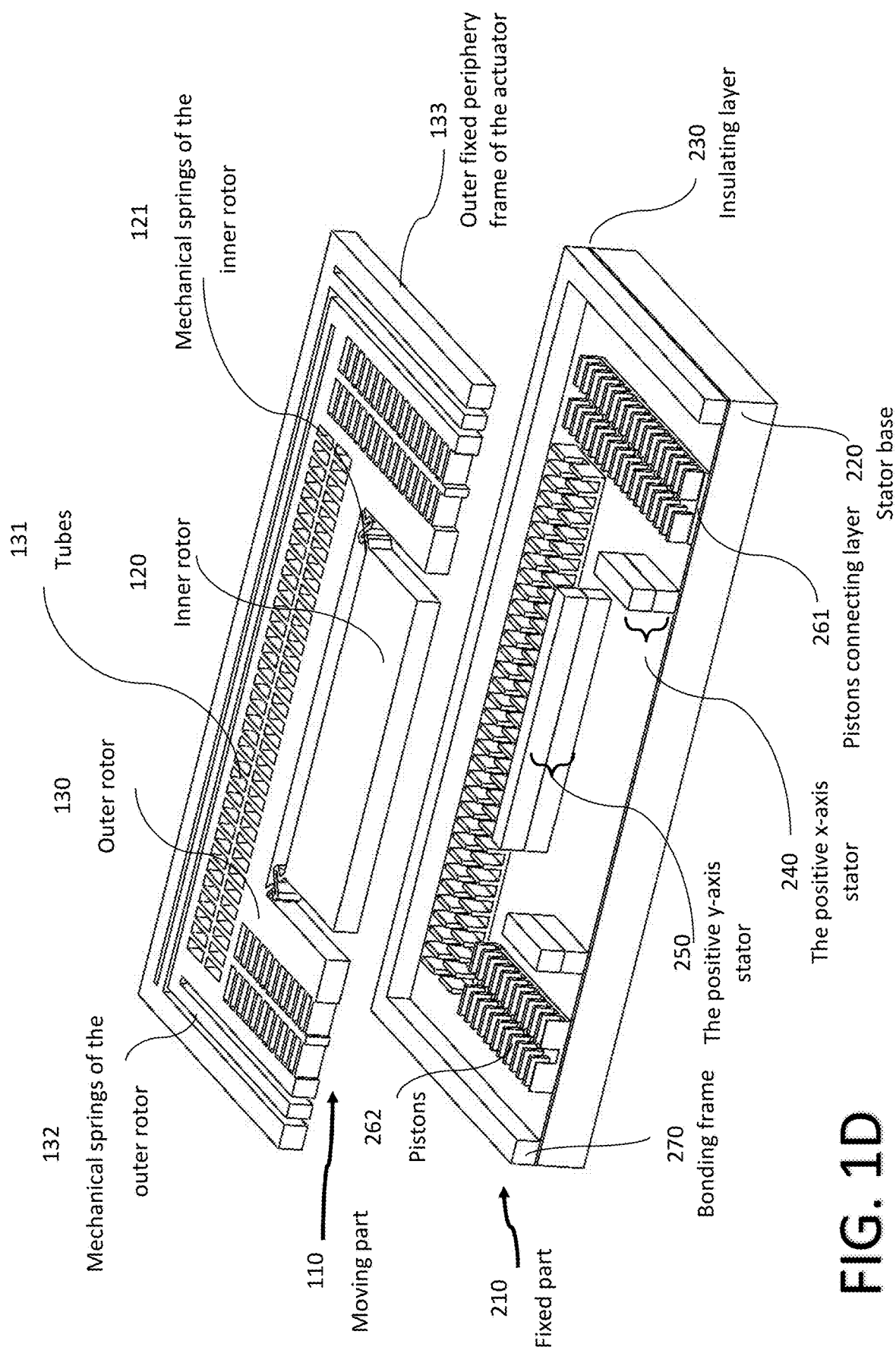
FIG. 1D illustrates an exploded cross-sectional view of FIG. 1A that shows the internal structure of the moving and fixed parts of the novel AF and super resolution MEMS actuator.

The present invention of the MEMS electrostatic microactuator for AF and super resolution 100 is illustrated in FIG. 1A-1D. The actuator can be made of two Silicon wafers: upper 102 and lower 101 wafers or any other semiconductor material. The actuator consists of two parts: moving 110 and fixed 210. The moving part comprises an inner rotor 120 (acts as load stage) that is connected to an outer rotor 130 via mechanical springs 121. The inner rotor has multiple side walls that each represents a moving plate of the capacitive parallel plate electrodes of the actuator. The outer rotor comprises of a plurality of openings (tubes) 131 that each is surrounded by walls forming the outer rotor. The outer rotor is connected to the outer fixed periphery frame of the actuator 133 via mechanical springs 132.

The fixed part of the actuator comprises a stator base 220, an electrically insulating layer 230, a number of stators (x, y, ad z stators) located above the insulating layer, and a bonding frame 270. The x-axis stator consists of two groups of stators: positive x-axis stator 240 and negative x-axis stator 241. The positive and negative x-axis stators form the fixed plates of the x-axis parallel-plate electrodes and are overlapped with the inner rotor moving plates and in the presence of a voltage signal, the inner rotor provides bi-directional translations along the x-axis enabled by the two x-axis stators.

The y-axis stator consists of two groups of stators: positive y-axis stator 250 and negative y-axis stator 251. The positive and negative y-axis stators form the fixed plates of the y-axis parallel-plate electrodes and are overlapped with the inner rotor moving plates and in the presence of a voltage signal, the inner rotor provides bi-directional translations along the y-axis.

The z-axis stator comprises a plurality of pistons 262 that protrude upward and are vertically aligned with the tubes in the outer rotor and connected with each other via electrically connecting layer 261. In the presence of a voltage input across the outer rotor and the pistons 260, the outer rotor provides translation motion along the z-axis. The bonding frame of the fixed part is used as bonding interface between the moving and fixed parts of the actuator.

One of the main advantageous features of the present invention is the total mechanical decoupling between all motions along the three axes. This decoupling of motions was enabled using a decoupling flexure mechanism between the inner and the outer rotors and using the decoupled capacitive electrode configurations (parallel-plate and piston-tube) that help prevent the interference between the different electrostatic fields when the actuator moves along all axes.

The mechanical springs of the inner rotor are designed to be compliant/elastic along the in-plane axes x and y, and highly stiff along the out of plane z axis, while the mechanical springs of the outer rotor are designed to be compliant/elastic along the optical axes z and highly stiff along the in-plane axes. When the inner rotor moves along the in-plane axes, the outer rotor is not affected since the in-plane stiffness of the outer is orders of magnitudes larger than the in-plane stiffness of the inner rotor (e.g. 10,000's larger than the in-plane axes stiffness of the inner rotor).

Figure 2A:
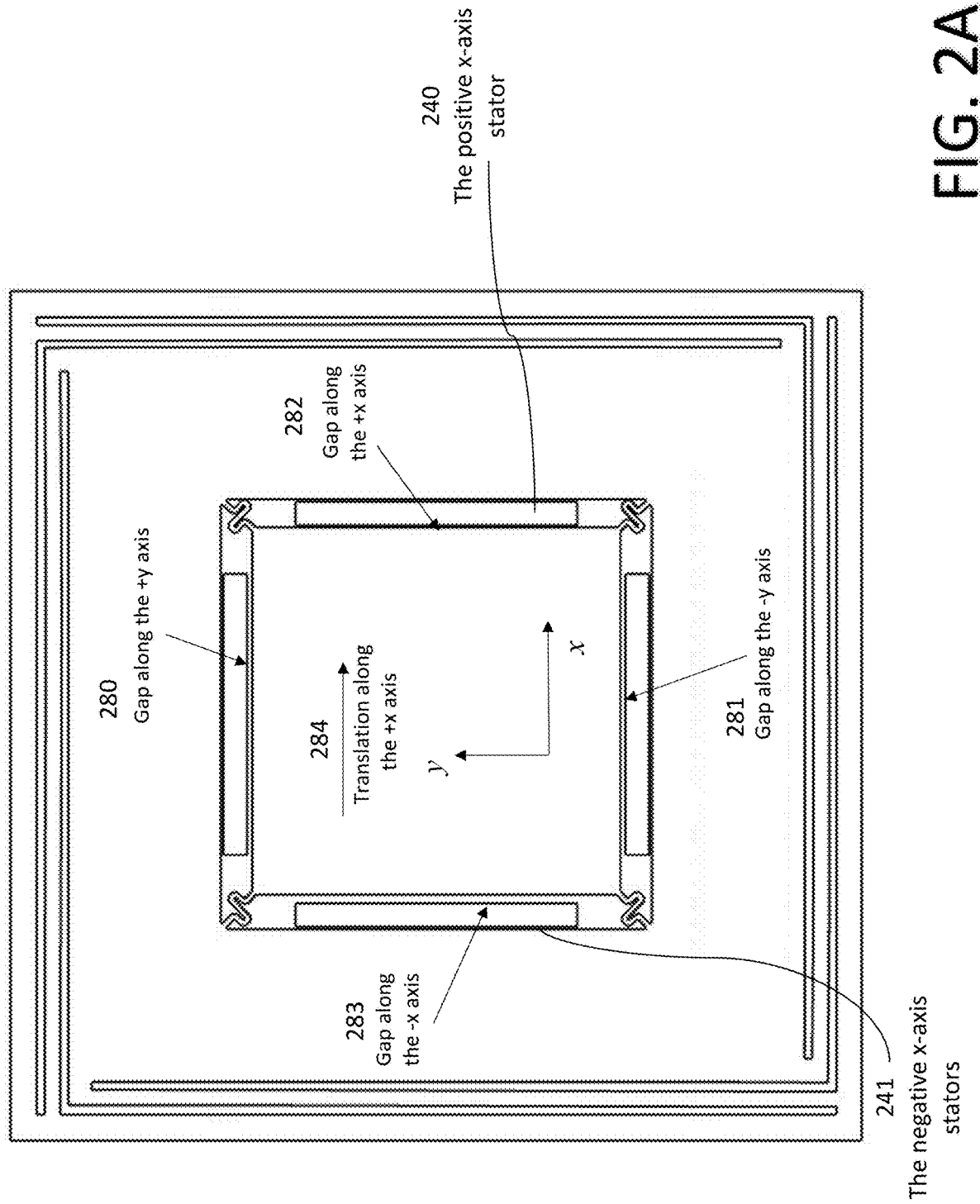
FIG. 2A is a top view illustrating the translation motion of the inner rotor along the positive direction of the x-axis when a voltage signal is applied across the parallel plate electrodes of the inner rotor and the positive x-axis stator.

The decoupling between the electrostatic fields along the three axes of motion can be explained in the view of the fact that when a voltage signal is applied to the positive x-axis stator (parallel-plate electrodes), refer to FIG. 2A, electrostatic forces are developed between the plates (sides) of the positive x-axis stator 240 and the adjacent sides of the inner rotor leading to the inner rotor being pulled into the positive direction of the x-axis in a translation motion 284 leading to the shrinking of the horizontal gap 282 between the inner rotor and the positive x-axis stator and the gap 283 between the inner rotor and the negative x-axis stator becomes larger. This translation along the x-axis happens while the capacitance between the inner rotor and the y-axis stators remain unchanged as the gaps 280 and 281 remain unchanged and the overlapping area of the y-axis electrodes remains also constant. That means no electrostatic field changes along the y-axis, hence no undesired motion is generated along the y-axis. For the z-axis electrodes, as the motion along the x-axis is mechanically decoupled because of the in-plane stiffness (along the x and y axes) of the outer rotor is extremely larger than the in-plane stiffness of the inner rotor (e.g. 10,000 times larger), the outer rotor doesn't move along the in-plane axes as a result of the actuation of the inner rotor along the x-axis.

Similarly, when a voltage signal is applied to the positive y-axis stator (parallel-plate electrodes), refer to FIG. 2B, electrostatic forces are developed between the plates (sides) of the positive y-axis stator 250 and the adjacent sides of the inner rotor leading to the inner rotor being pulled into the positive direction of the y axis in a translation motion 285 leading to the shrinking of the horizontal gap 280 between the inner rotor and the positive y-axis stator. The gap 281 between the inner rotor and the negative y-axis stator becomes larger. This translation along the y-axis happened while the capacitance between the inner rotor and the x-axis stators remains unchanged as the gaps 282 and 283 and the overlapping area of the electrodes along the x-axis remains constant. That means no electrostatic field changes along the x-axis, thus no undesired motion is generated along the x-axis.

Figure 2C:
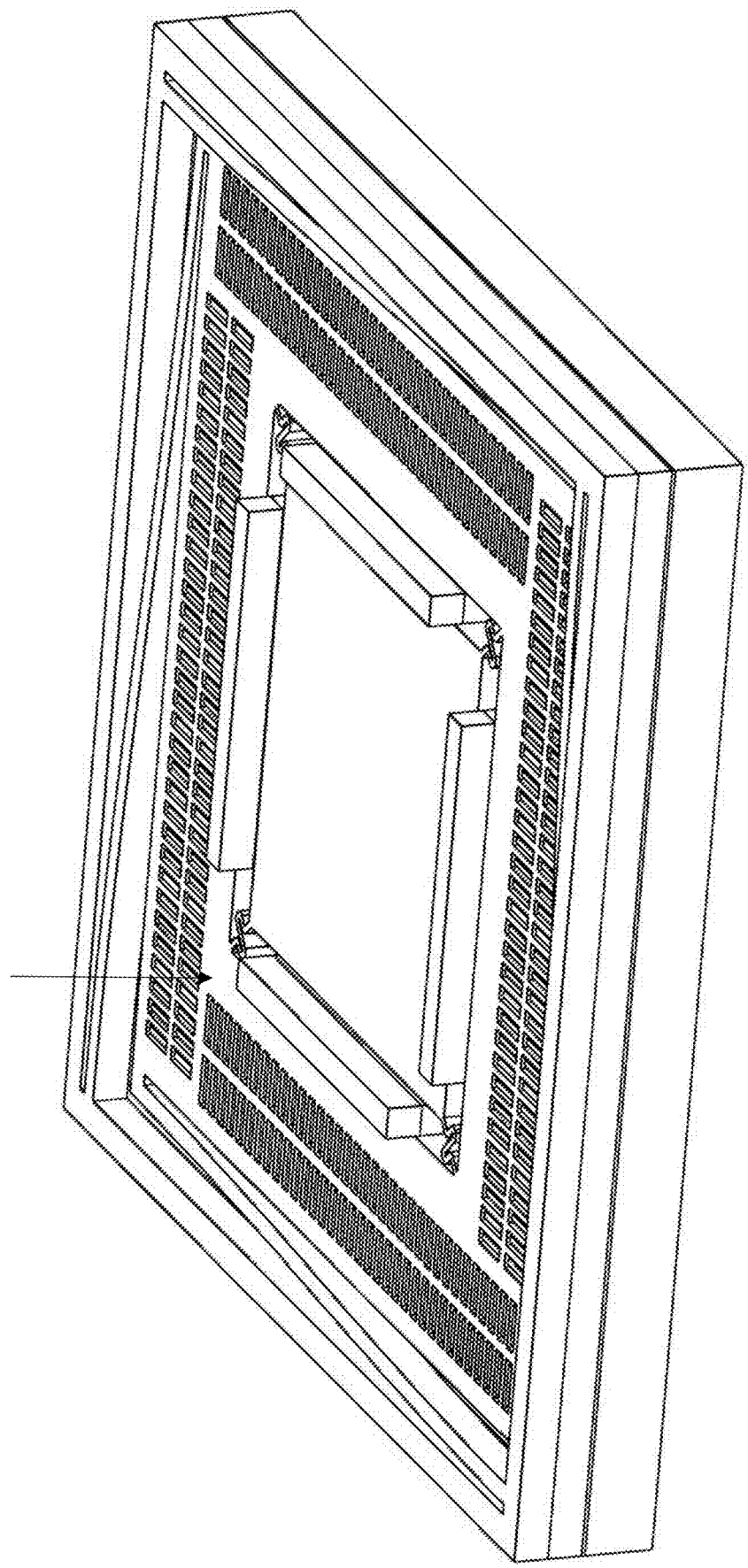
FIG. 2C is a top view illustrating the translation motion of the outer rotors along the z-axes when a voltage is applied between the pistons and tubes of the outer rotor and the z-axis stator.
Figure 2E:
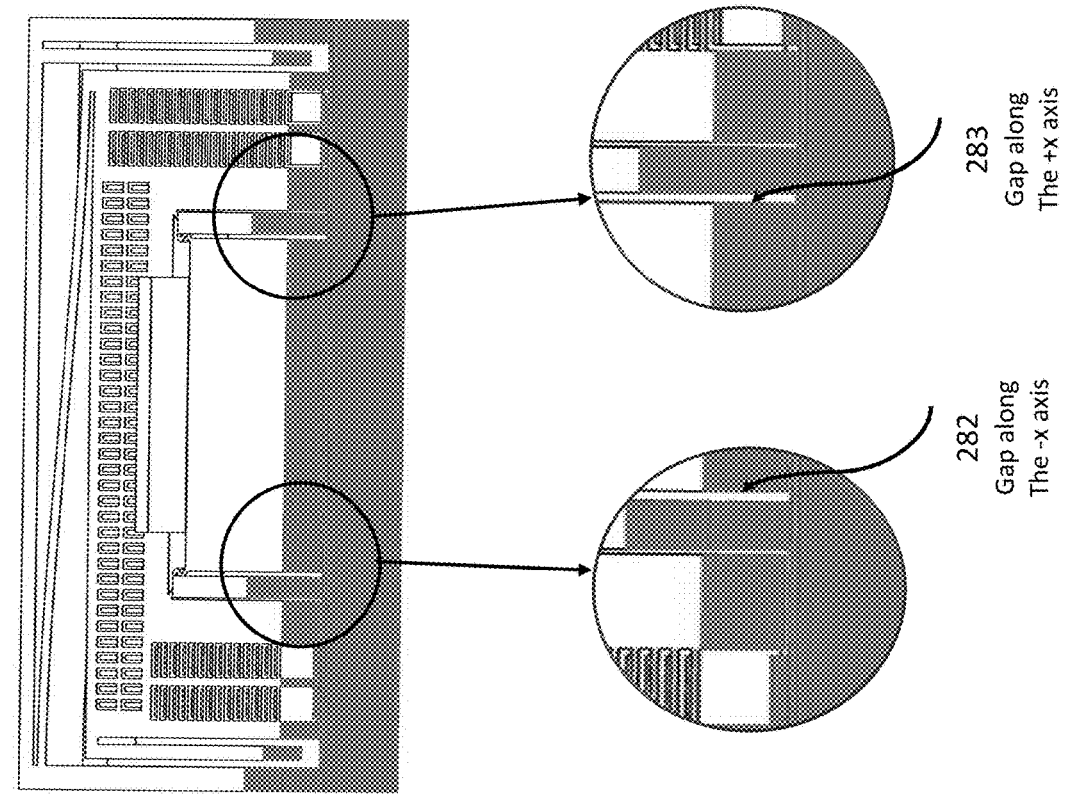
FIG. 2E is a cross-sectional view of the actuator illustrating the translation of the outer rotor along the z-axis while the total overlapping area and horizontal gap between the parallel plate electrodes of the inner rotor and stators remain constant.
Figure 2D:
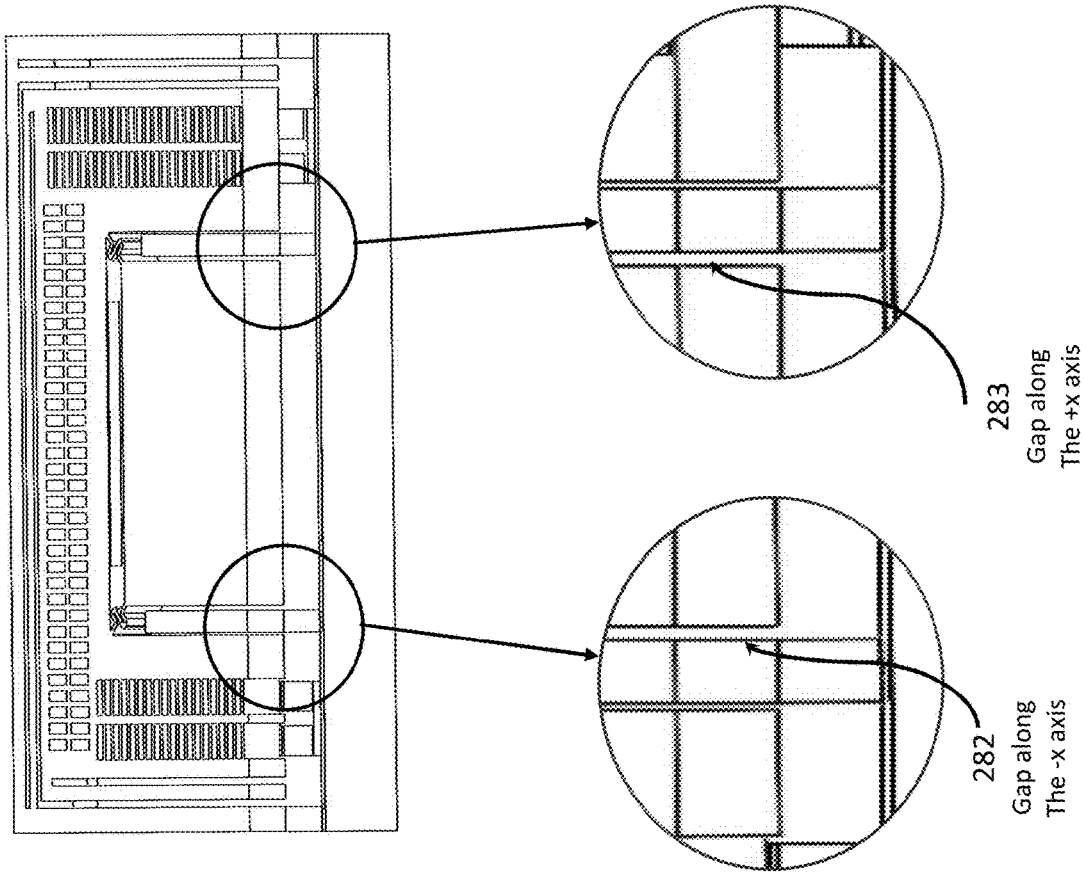
FIG. 2D is a cross-sectional view of the actuator showing the in-plane horizontal gap between the parallel plates along the in-plane axes when the actuator is at rest position.
Figure 2F:
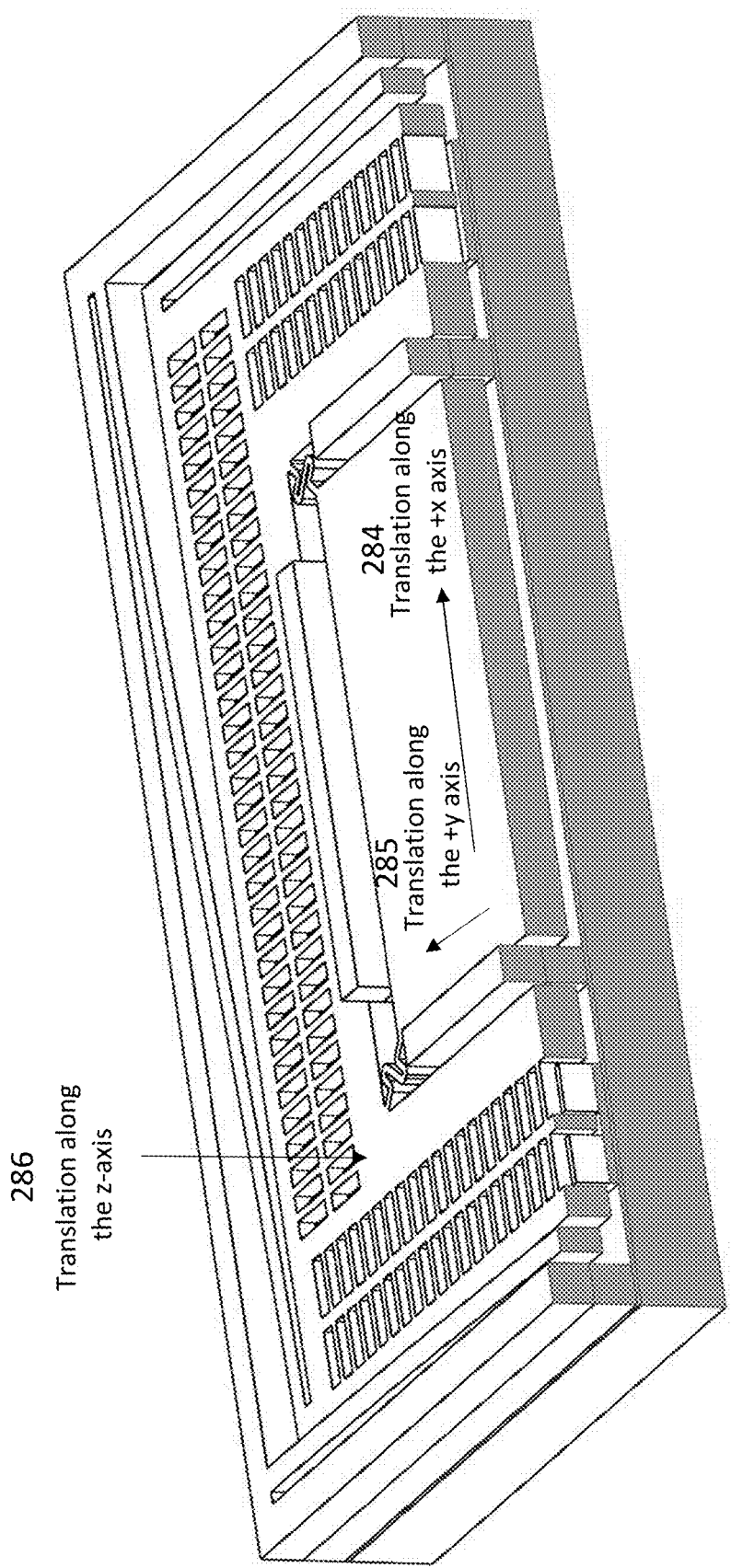
FIG. 2F is a perspective cross-sectional view of the actuator illustrating the three translation motions of the inner and outer rotors along the x, y and z axes when a voltage is applied between the parallel plate electrodes of the inner rotor and the x and y axes' stators and between the pistons and tubes of the outer rotor and stator.

When a voltage signal is applied to the z-axis stator (pistons), refer to FIG. 2C, electrostatic forces are developed between the pistons of the z-axis stator and the adjacent sides of the tubes in the outer rotor leading to the outer rotor being pulled down along the z-axis. This translation 286 along the z-axis happens while the capacitance along of the x and y axes remains constant (both the overlapping area between the inner rotor and x and y axes' stators and the gaps between the plates remain unchanged), meaning that no electrostatic field changes between the in-plane axes stators and the inner rotor. Therefore, no undesired motion is generated along the x and y axes. FIG. 2D and FIG. 2E further illustrate the mechanical decoupling between the inner rotor motion along the x and y axes and the outer rotor motion along the z axis. FIG. 2D shows the actuator outer rotor at rest position where no voltage is applied to the pistons' stator-as an example, the gaps between the inner rotor and the x-axis stators are illustrated. When the outer rotor is translated down along the z-axis, refer to FIG. 2E, the gaps 282 and 283 remain the same as they were at the rest position. The sides of the x-axis stators remain fully overlapping with the adjacent sides of the inner the rotor along the entire range of the z-axis translation stroke. FIG. 2F illustrates all three translation motions along the x, y, and z axes simultaneously.

Comb-drive electrodes could be used in the in-plane axes stators (x and y) to provide translation motion and the x and y axes as an alternative option to the parallel plate electrodes; however, the nature of the comb-drive electrodes does not enable the decoupling between the different axes motions. FIG. 3A-B illustrate the mechanical coupling between the x and y axes translations when comb-drive electrodes are used.

When a voltage signal is applied to the x-axis stators (comb-drive electrode in this case), electrostatic forces are generated between the fixed and moving fingers of the combs leading to the translation 301 of the inner rotor along the x axis; however, the gap 302 between the comb fingers in the y axis stators changes leading to an unbalanced electrical field (electrostatic forces) between the y axis stator comb and the inner rotor comb. This unbalance results in cross-axis coupling between the translation motions along the x and y-axis. Therefore, the motion is not decoupled when the comb-drive electrodes are used as opposed to parallel-plate electrodes where the electrode gap and the overlapping area remains unchanged along the other axes.

In addition, the parallel plate electrode configuration used in the present invention is more advantageous than the comb-drive due to the large force generated in the parallel plates due to the large capacitive area, but it is known to provide limited strokes due to the pull-in phenomenon which limits the stroke to one third of the initial gap. However, the super resolution functionality requires only pixel shift motion along the in-plane axes (the required stroke ranges from sub-micron to few microns—whatever the pixel width is) which makes the parallel-plate electrode configuration an ideal configuration for super resolution functionality. The large electrostatic force generated in the parallel-plate electrode enables relatively large in-plane stiffness of the inner rotor so that when loaded with an image sensor, the gravity effect due to the mass of the load has a minimal impact on the motion of the inner rotor.

The piston-tube electrode configuration used in the outer rotor usually enables the bi-axial tilt about the in-plane axes (x and y) in addition to the translation along the z-axis. However, it can be noticed that such tilts when used in the embodiment of the present invention, illustrated in FIG. 1A-2F, will result in a coupling effect between the motion of the inner and outer rotors. In other words, when the outer rotor tilts by applying a voltage signal to an array of pistons in one of the sides of the actuator, the inner rotor tilts accordingly, leading to a capacitance change between the inner rotor and x and y axes stators. Therefore, the motions (bi-axial tilts of the outer rotor and the translation of the inner rotor along the x and y axes) are coupled.

Figure 4:
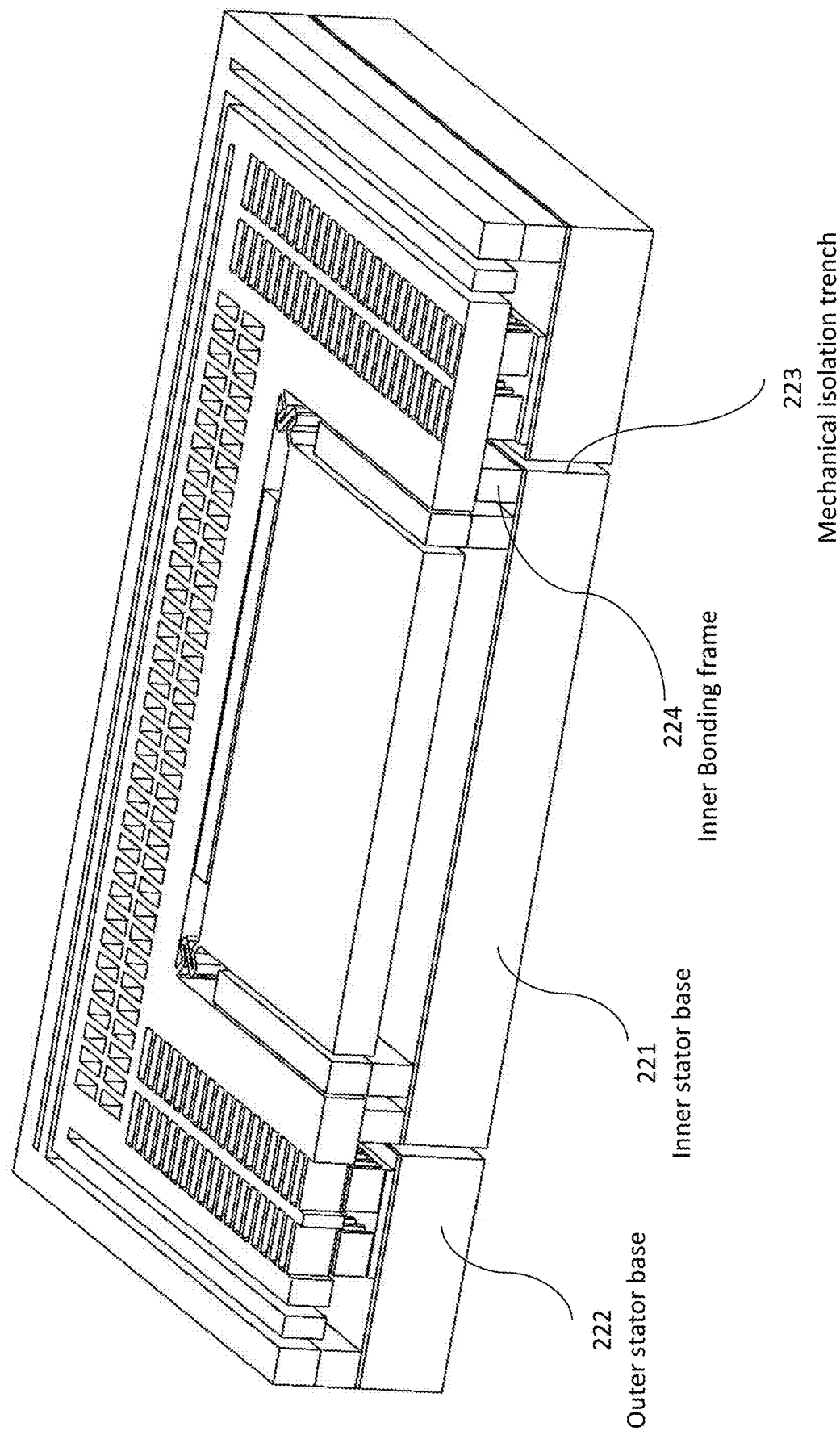
FIG. 4 illustrates a perspective cross-sectional view of another embodiment of the present invention in which the x and y axes stators are mechanically separated from the z-axis stators via mechanical trenches while mechanically attached to the outer rotor.

To avoid such coupling issue, another embodiment of the presented invention is disclosed. The new embodiment, has a similar structure to the first embodiment except that a mechanical trench 223 is introduced within the thickness of the stator base so that the base is split into two parts: inner stator plate 221 and outer stator plate 222 as shown in FIG. 4. This mechanical isolation between the stators of x and y axes and the pistons stator enable the outer rotor to provide tilt motion about the x and y axes without changing the electrode capacitance between the inner rotor and x and y axes stators. Therefore, the tilt motion of the outer rotor is totally decoupled from the x and y axes translations. An inner bonding frame 224 is also added to the structure such that it mechanically connects the inner stator base directly with outer rotor such that the entire structures (all x and y stators) supported by the inner stator base will be rigidly attached to the outer rotor and moving along with it. The piston stator (or the z-axis stator) in the outer stator base are segmented into multiple array of pistons (ideally two opposite arrays along the x axis and two opposite arrays along the y axis) so that they can enable bi-axial tilt motion about the in-plane axes when a voltage signal is applied to one of these arrays.

Figure 5C:
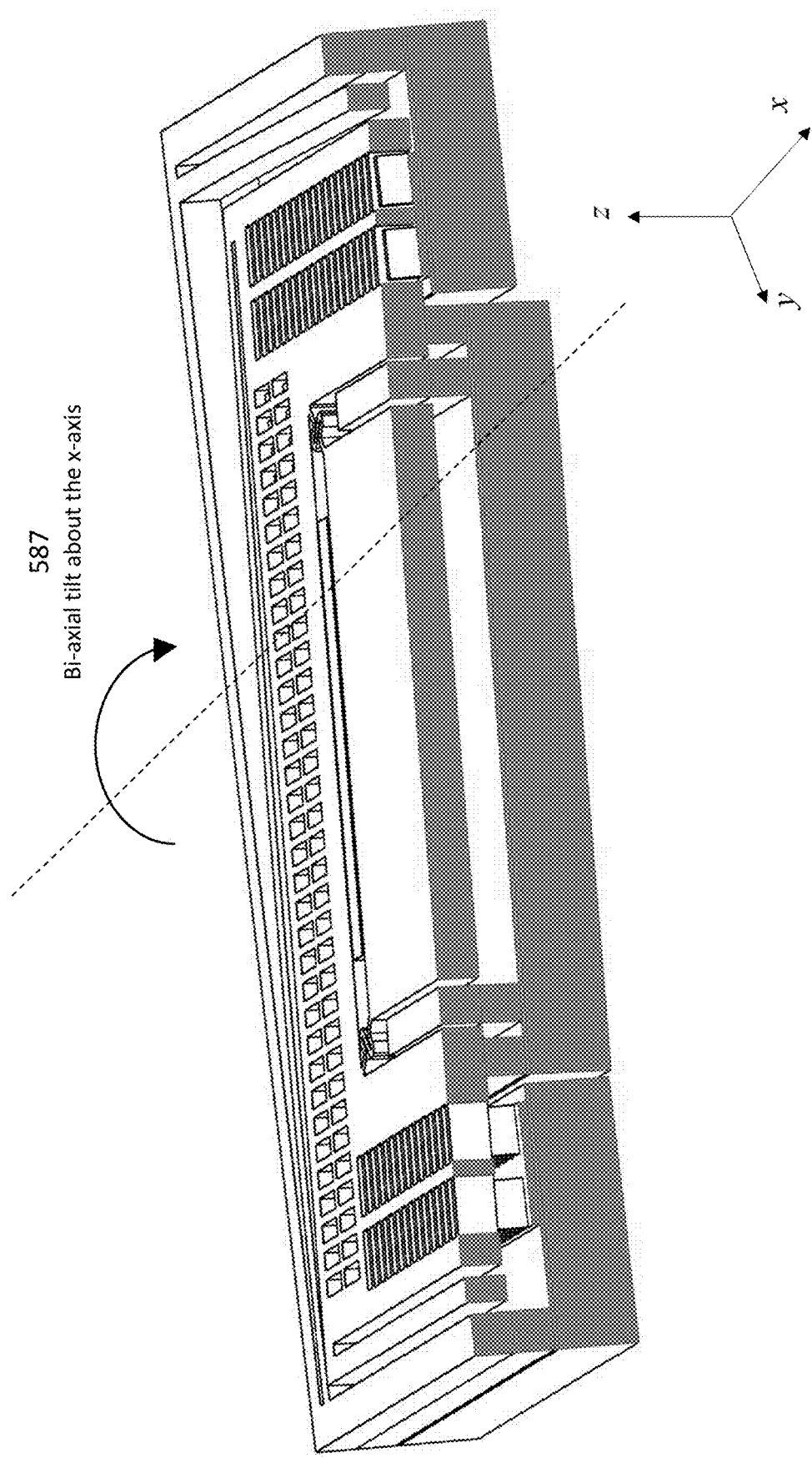
FIG. 5C is a perspective cross-sectional view illustrating the two translation motions of the inner rotor along the x, y axes and bi-axial tilt motion of outer rotors about the x-axis when a voltage is applied between the parallel plate electrodes of the inner rotor and the and x and y axes' stators and between an array of pistons and tubes of the outer rotor and stator.
Figure 5D:
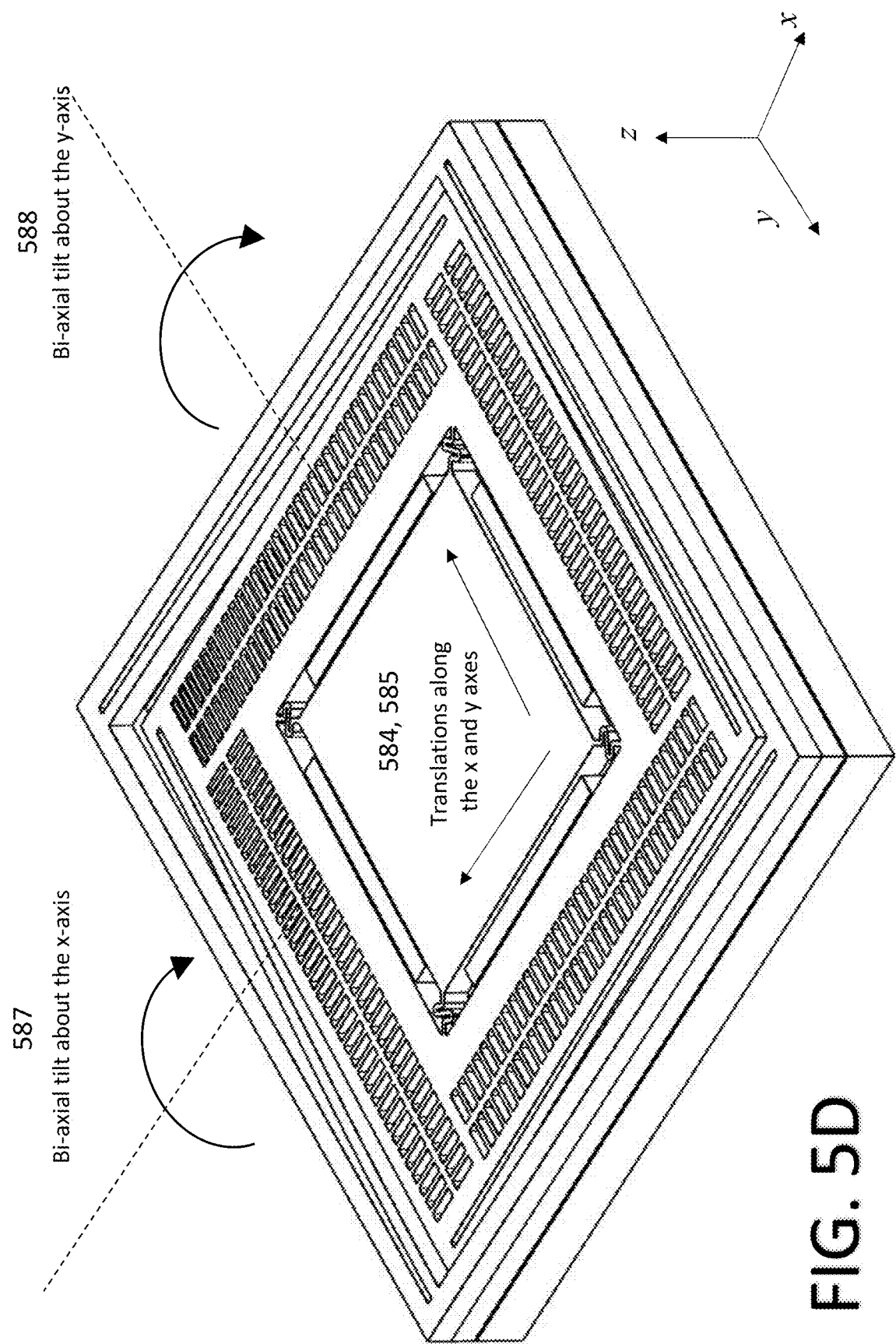
FIG. 5D is a perspective cross-sectional view illustrating the two translation motions of the inner rotor along the x, y axes and bi-axial tilt motions of the outer rotors about the x and y axes when a voltage is applied between the parallel plate electrodes of the inner rotor and the and x and y axes' stators and between two arrays of pistons and tubes of the outer rotor and stator.

FIG. 5A-D show the motions of the second embodiment of the actuator. FIG. 5A and FIG. 5B show the inner rotor translation along the x-axis 584 and along the y-axis 585 while the outer rotor translates along the z-axis 586. It can be seen in FIG. 5B that the entire inner stator base holding the inner rotor and x and y axes' stators move along with the outer rotor along the z-axis as they are mechanically connected, while the inner rotor is stationary with respect to the its x and y stators along the x and y axis. FIG. 5C illustrates the bi-axial tilt motion 587 about the x-axis while the capacitance between the inner rotor and the x and y axes stators stay constant as a result of the mechanical isolation between the in-plane stators (x and y) and the out-of-plane stators (the z-axis piston stators). FIG. 5D shows the bi-axial tilt motion of the outer rotor (tilt motion about the x axis 587 and y axes 588) and the translations along the x-axis 584 and y axis 585 simultaneously.

Figure 6A:
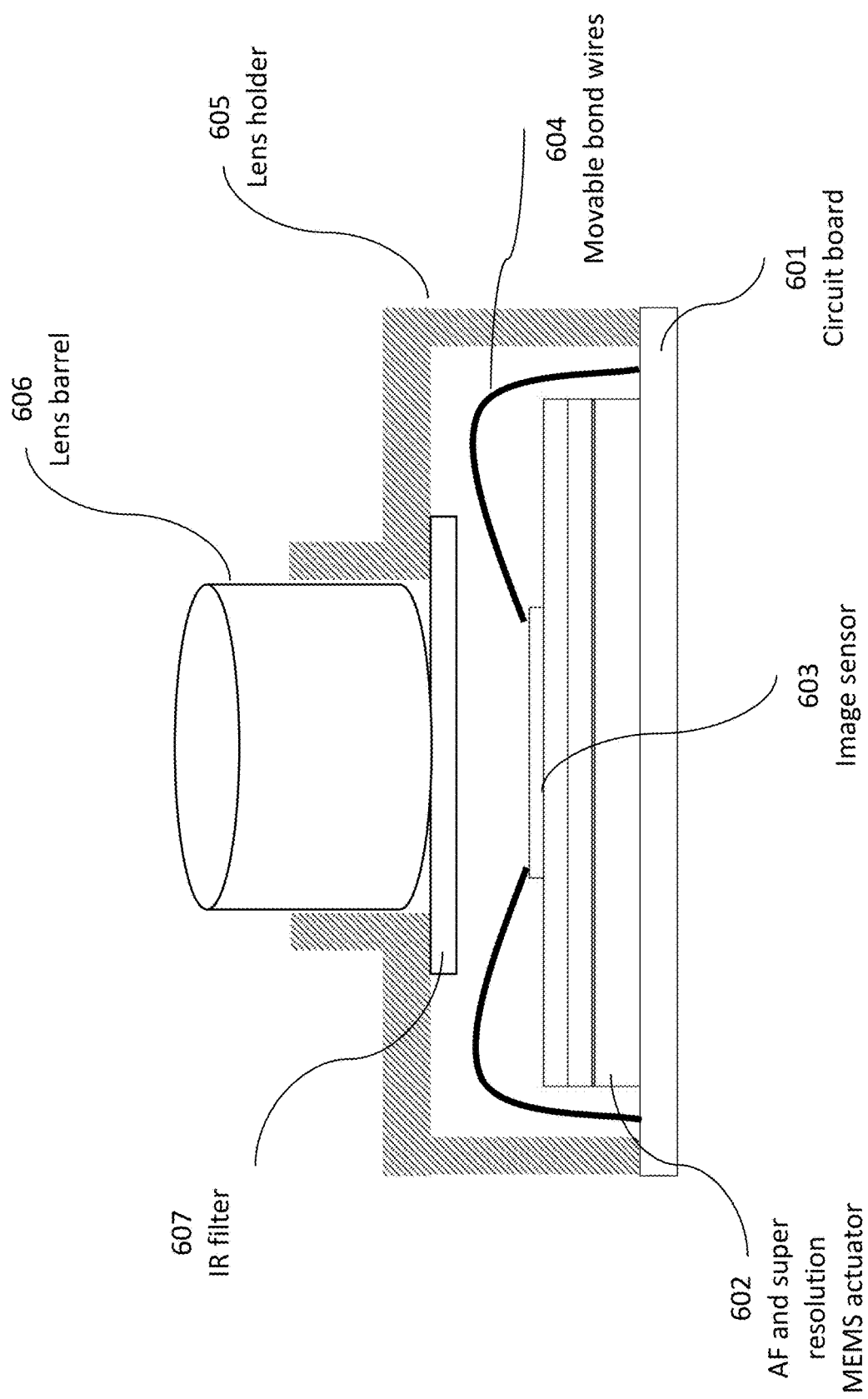
FIG. 6A illustrates a cross-sectional view of a camera system incorporating the novel MEMS electrostatic actuator to achieve the AF and super resolution imaging features, where a circuit board is placed beneath the MEMS actuator.

The present invention could be used to achieve AF and super resolution imaging in cameras by utilizing the total decoupling between the three axis translations along the x, y and z axes. FIG. 6A illustrates an example of a camera that incorporates the present invention of the MEMS actuator for AF and super resolution imaging. The camera consists of a circuit board 601, the MEMS actuator 602, an image sensor 603, movable bond wires 604, an IR filter 607, a lens holder 605 holding a lens barrel 606. The AF and super resolution actuator placed on the top of the circuit board holding an image sensor. The image sensor is bonded to the circuit board via movable bond wires. The lens holder covers the MEMS actuator and the image sensor while holding the lens barrel. An IR filter is positioned between the lens barrel and image sensor. For AF functionality, the image sensor is translated by the actuator along the optical axis z, and for the super resolution functionality, the sensor is translated along the x and y axes sub-micron to few microns stroke (representing a pixel shift). A number of images will be taken that are a pixel or a sub-pixel-shifted with respect to each other, then processed to generate a larger resolution image. The floating movable bond wires are made compliant along the three axes to allow the motion of the sensor.

Figure 6B:
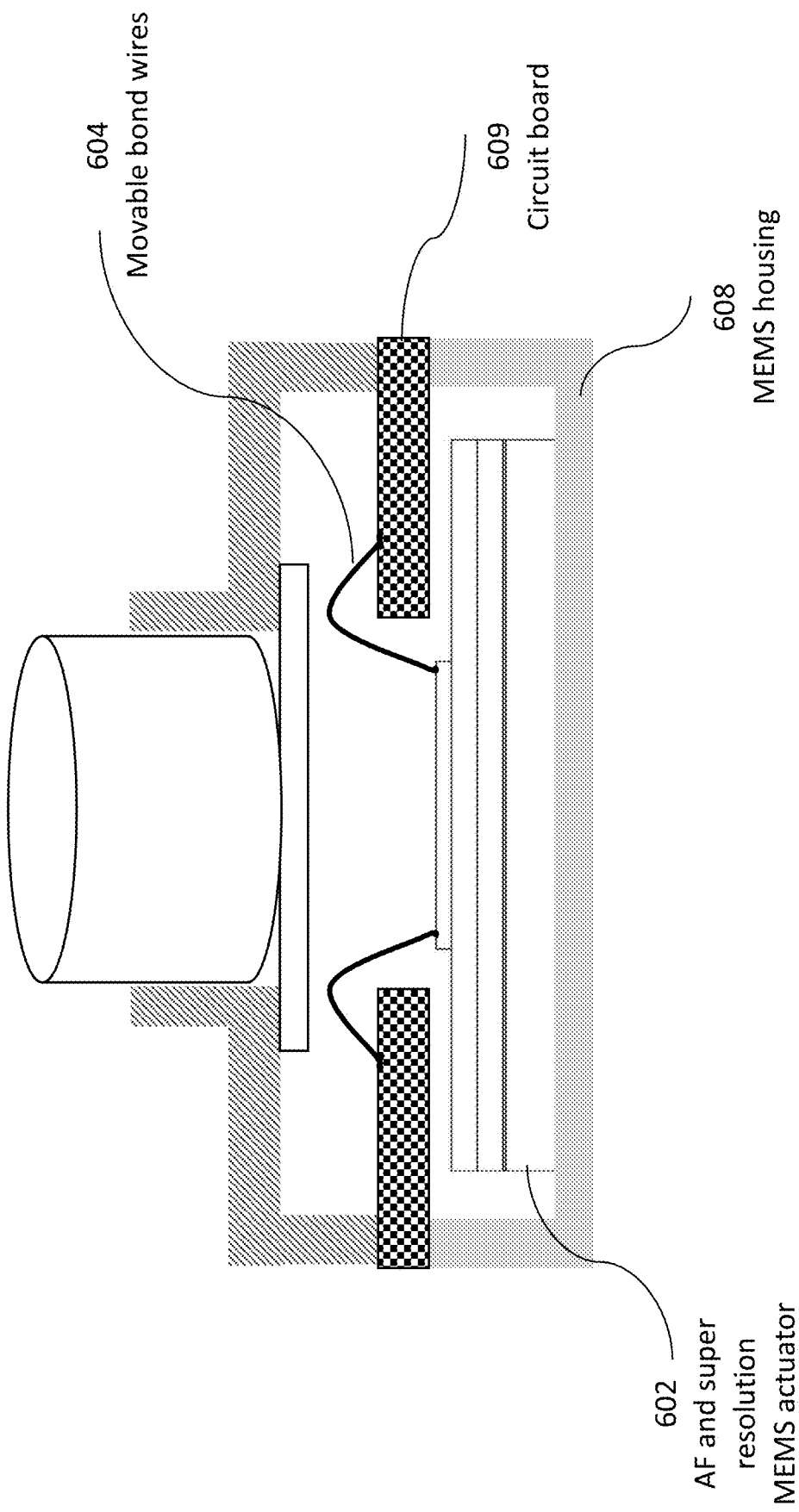
FIG. 6B illustrates a cross-sectional view of another camera system incorporating the novel MEMS electrostatic actuator to achieve the AF and super resolution imaging features, where the actuator is placed within a MEMS housing and the circuit board is placed on the top of the MEMS actuator.

In another example, the structure of the camera may take different form, refer to FIG. 6B, where the MEMS actuator is placed in a MEMS housing 608 which is attached the circuit board from the bottom side. The circuit board 609 has cut-out at the middle to allow the light coming through the lens barrel to reach the image sensor. The image sensor is bonded to the circuit board via movable bond wires 604.

One application of the bi-axial motion of the outer rotor could be achieving active alignment such that it corrects for the misalignment between the optics and image sensor planes due to assembly imperfections.

Figure 7:
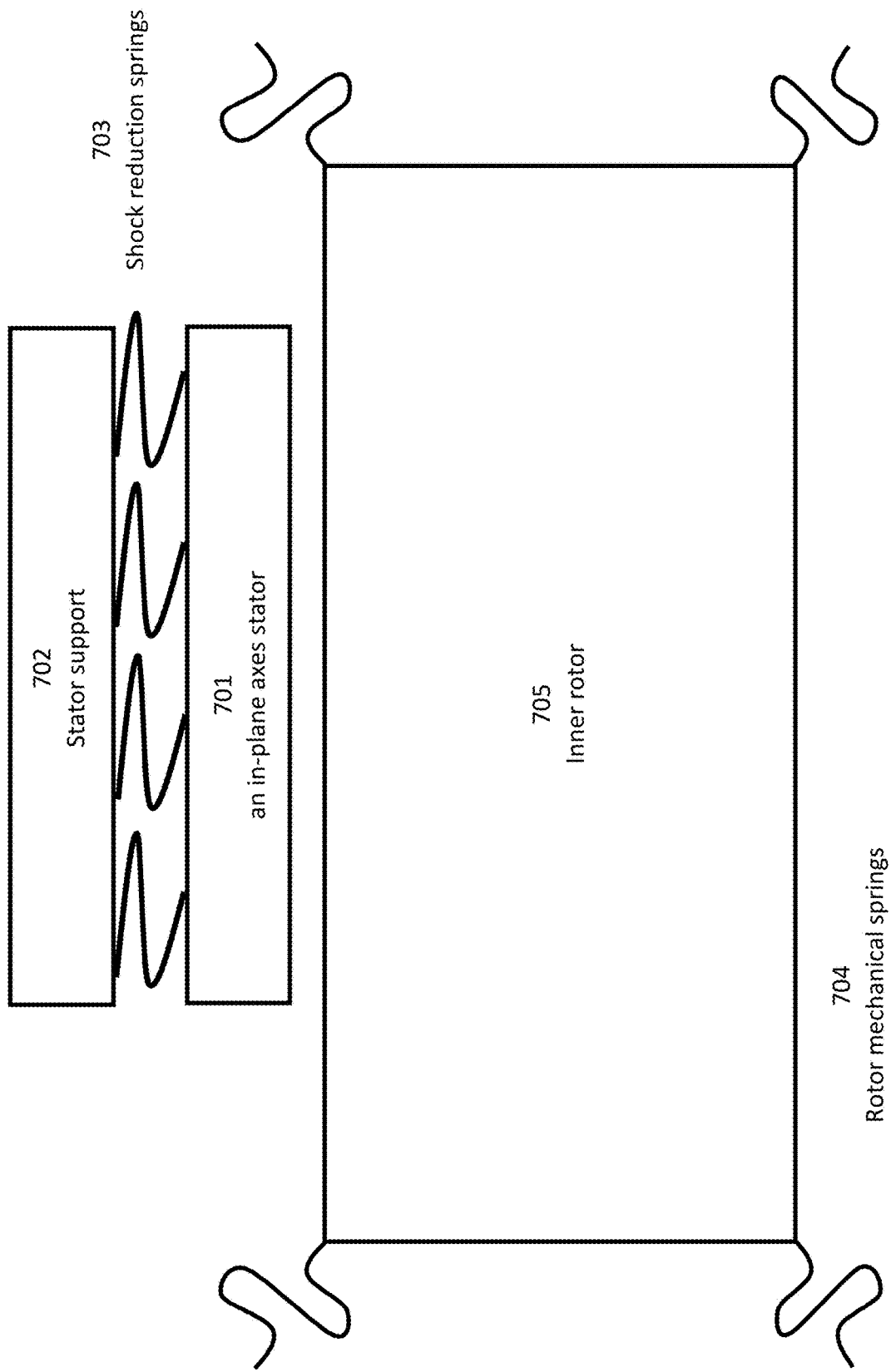
FIG. 7 illustrates a top view of shock reduction springs used in the in-plane stators to reduce the shock impact on the actuator parts.

Camera actuators are required to be shock resistant to stay functional after severe drops. In smartphones, camera actuators could be exposed to high shock levels of >10,000 g. To enable the actuator parts to stay intact during such shocks, the in-plane stators could be utilized as mechanical stoppers to restrict the rotor motion by having shock reduction springs as shown in FIG. 7. Shock reduction springs 703 are incorporated between the in-plane axes stators 701 and their support 702. Such springs have large stiffness and they deflect only during severe shock when the inner rotor 705 of the actuator moves randomly and hit such stators. The stators will deflect to reduce the amount of the shock and to prevent silicon chipping that may ensue from the collision between two rigid Si parts (rotor and stator). By making the stator complaint when hit by the rotor, such Si breakage or chipping will be mitigated. It is important to highlight that the stiffness of the stator shock reduction springs is orders of magnitude larger than the rotor mechanical springs 704 that deflect in response to the electrostatic force while the stators shock springs that will only deflect during severe shocks.

It could be apparent to the one with the ordinary skills in the art that the current invention could be altered in many ways without the departure from the soul of the present invention. For example, one may alter between the position of the inner rotor and the outer rotor such that the inner rotor provides the z-axis motion while the outer rotor provides in-plane motion along the x and y axes.

Figure 8:
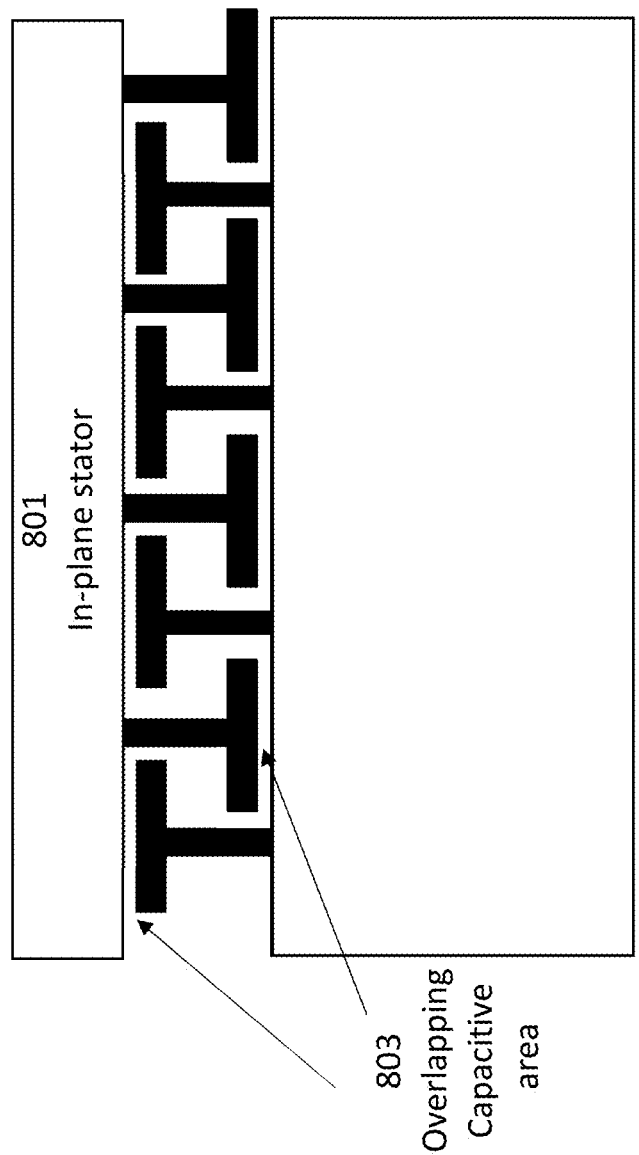
FIG. 8 illustrates a top view of another embodiment of the parallel plate electrode shapes that can be utilized to increase the overlapping capacitive area between the stator and rotor.

It could be apparent to the one with the ordinary skills in the art the stators electrode configuration could take different shapes, while the parallel-plate principle still forms the basis of the driving electrode where the motion of the actuator is along the perpendicular (normal) direction to the plates. FIG. 8 shows an example of utilizing T-shaped protrusions so that the overlapping capacitive area 803 between the in-plane stator 801 and inner rotor 802 is much larger than two straight parallel-plate.

It could be apparent to the one with the ordinary skills in the art that pistons and tubes could be added to the inner rotor such that the inner rotor translates down with respect to the x and y stators to provide an extra stroke along the z-axis while not affecting the capacitance between the x and y stators.

It could be also apparent to the one with the ordinary skills in the art that the current invention of the actuator could be used as a MEMS sensor. Instead of applying voltages to provide motion, the present invention can be used to read the capacitance of the actuator electrodes in response, for example, to force, acceleration, touch on any other physical property that can be measured by the change of the electrode capacitance.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

With respect to the above description, it is to be realized that the optimum relationships for the parts of the invention in regard to size, shape, form, materials, function and manner of operation, assembly and use are deemed readily apparent and obvious to those skilled in the art, and all equivalent relationships to those illustrated in the drawings and described in the specification are intended to be encompassed by the present invention.

What is claimed is:

1. A MEMS electrostatic microactuator, the microactuator comprising:
   a) a moving part defining an x-y plane, and a z-axis being normal to the x-y plane, the moving part comprises an inner rotor and an outer rotor and an outer periphery, wherein the inner rotor comprises a load stage and a set of moving plates of a set of parallel-plate capacitive electrodes, and the inner rotor is attached to the outer rotor via a plurality of mechanical springs, said outer rotor comprises a plurality of openings or tubes that are attached to the outer periphery via a plurality of mechanical springs;
   b) a fixed part, comprising one or multiple x-axis stators; one or multiple y-axis stators, one or multiple z-axis stators, a stator base, and a bonding frame, wherein the one or multiple x-axis and y-axis stators form a set of fixed plates of the set of parallel-plate capacitive electrodes and wherein each said x-axis and y-axis stator is electrically addressable; the one or multiple z-axis stator comprises of a plurality of pistons that are protruding upward and are aligned vertically with said tubes in the outer rotor; wherein the x-axis, y-axis and z-axis stators are supported by the stator base and are electrically separated using an electrically insulating layer;
   whereby in the presence of a voltage signal applied across the inner and outer rotors and their respective stators, the inner rotor provides a bi-directional translation along the x-axis; and/or a bi-directional translation along the y-axis; and/or a translation motion along the z-axis.

2. The MEMS electrostatic microactuator in claim 1, wherein the x-, y-, and z-axes stators are electrically insulated from each other through an insulating layer of silicon on insulator (SOI) wafer.

3. The MEMS electrostatic microactuator in claim 1, wherein the pistons within each z-axis stator are electrically connected with each other through an electrically conductive layer.

4. The MEMS electrostatic microactuator in claim 1, wherein said fixed and moving parallel-plate capacitive electrodes are configured in shape and form to increase the overlapping capacitance area.

5. The MEMS electrostatic microactuator in claim 1, wherein said in-plane stators incorporate shock reduction springs that deflect during drops and severe shock in response to the collision between the moving part and the in-plane stators.

6. The MEMS electrostatic microactuator in claim 1, wherein a sensor or an optical element is attached to the load stage of the microactuator, said optical element is moved in all degrees of freedom motions provided by the microactuator.

7. The MEMS electrostatic microactuator in claim 1, wherein the inner rotor and its respective stators is interchangeable with the outer rotor and its respective stators and one can replace the other in terms of their position with respect to the load so that the inner rotor provides motion along the z-axis, and the outer rotor provides in-plane translations along the x and y axes.

8. A MEMS electrostatic microactuator, comprising:
   a) a moving part defining an x-y plane, and a z-axis being normal to the x-y plane, the moving part comprises an inner rotor and an outer rotor and an outer periphery, wherein the inner rotor comprises a load stage and a set of moving plates of a set of parallel-plate capacitive electrodes; said inner rotor is attached to the outer rotor via a plurality of mechanical springs; said outer rotor comprises a plurality of openings or tubes that are attached to the outer periphery via a plurality of mechanical springs;
   b) a fixed part, comprising one or multiple x-axis stators, one or multiple y-axis stators, one or multiple z-axis stator, an inner and an outer stator bases, an inner bonding frame, and an outer bonding frame, wherein the one or multiple x-axis and y-axis stators form a set of fixed plates of the set of parallel-plate electrodes and wherein each said x-axis and y-axis stator is electrically addressable; said x- and y-axes stators are supported by the inner stator base and are mechanically isolated from the z-axis stators via a trench; the inner stator base is mechanically attached to the outer rotor via the inner bonding frame; the z-axis stators comprises a set of arrays of pistons that are protruding upwardly and are vertically aligned with said tubes in the outer rotor; wherein each z-axis stator of pistons is electrically addressable; said z-axis stators are supported with the outer stator base that are connected to the outer periphery of the actuator using the outer bonding frame,
   whereby in the presence of a voltage signal across the inner and outer rotors and their respective stators, the inner rotor provides bi-directional translation along the x axis; and/or a bi-directional translation along the y axis; and the outer rotor provides translation motion along the z axis and/or bi-axial tilt motion about the x-y-plane.

9. The MEMS electrostatic microactuator in claim 8, wherein the x-, y-, and z-axes stators are electrically insulated from each other through an insulating layer of silicon on insulator (SOI) wafer.

10. The MEMS electrostatic microactuator in claim 8, wherein the pistons within each z-axis stator are electrically connected with each other through an electrically conductive layer.

11. The MEMS electrostatic microactuator in claim 8, wherein said set of parallel-plate capacitive electrodes are configured in shape and form to increase the overlapping capacitance area.

12. The MEMS electrostatic microactuator in claim 8, wherein said in-plane stators incorporate shock reduction springs that deflect during drops and severe shock in response to the collision between the moving part (rotor) and the in-plane stators.

13. The MEMS electrostatic microactuator in claim 8, wherein a sensor or an optical element is attached to the said load stage of the microactuator, said optical element is moved in all degrees of freedom motions provided by the actuator.

14. The MEMS electrostatic microactuator in claim 8, wherein the inner rotor and its respective stators is interchangeable with the outer rotor and its respective stators and one can replace the other in terms of their position with respect to the load so that the inner rotor provides motion along the z-axis, and the outer rotor provides in-plane translations along the x and y axes.

15. A camera module comparing:
   a) a MEMS electrostatic microactuator comprising:
      i) a moving part defining an x-y plane, and a z-axis being normal to the x-y plane, the moving part comprises an inner rotor and an outer rotor and an outer periphery, wherein the inner rotor comprises a load stage and a set of moving plates of a set of parallel-plate capacitive electrodes, and the inner rotor is attached to the outer rotor via a plurality of mechanical springs, said outer rotor comprises a plurality of openings or tubes that are attached to the outer periphery via a plurality of mechanical springs;
      ii) a fixed part, comprising one or multiple x-axis stators; one or multiple y-axis stators, one or multiple z-axis stators, a stator base, and a bonding frame, wherein the one or multiple x-axis and y-axis stators form a set of fixed plates of the set of parallel-plate capacitive electrodes and wherein each said x-axis and y-axis stator is electrically addressable; the one or multiple z-axis stator comprises of a plurality of pistons that are protruding upward and are aligned vertically with said tubes in the outer rotor; wherein the x-axis, y-axis and z-axis stators are supported by the stator base and are electrically separated using an electrically insulating layer;
   b) an image sensor attached to the load stage of the said microactuator, wherein the said image sensor is wire-bonded directly to the outside circuit board via movable wires,
   c) a circuit board attached to the top or bottom side of the said microactuator,
   d) optical lenses attached to the said housing,
   whereby the said microactuator displaces the image sensor along the in-plane axes x and y to achieve super resolution imaging and/or translates the image sensor along the optical axis (z) to achieve autofocus.

16. The camera module of claim 15, wherein the wire-bonding signals of the image sensor are channeled through the microactuator structure.

17. A camera module comparing:
   a) a MEMS electrostatic microactuator comprising:
      i) a moving part defining an x-y plane, and a z-axis being normal to the x-y plane, the moving part comprises an inner rotor and an outer rotor and an outer periphery, wherein the inner rotor comprises a load stage and a set of moving plates of a set of parallel-plate capacitive electrodes; said inner rotor is attached to the outer rotor via a plurality of mechanical springs; said outer rotor comprises a plurality of openings or tubes that are attached to the outer periphery via a plurality of mechanical springs;
      ii) a fixed part, comprising one or multiple x-axis stators, one or multiple y-axis stators, one or multiple z-axis stator, an inner and an outer stator bases, an inner bonding frame, and an outer bonding frame, wherein the one or multiple x-axis and y-axis stators form a set of fixed plates of the set of parallel-plate electrodes and wherein each said x-axis and y-axis stator is electrically addressable; said x- and y-axes stators are supported by the inner stator base and are mechanically isolated from the z-axis stators via a trench; the inner stator base is mechanically attached to the outer rotor via the inner bonding frame; the z-axis stators comprises a set of arrays of pistons that are protruding upwardly and are vertically aligned with said tubes in the outer rotor; wherein each z-axis stator of pistons is electrically addressable; said z-axis stators are supported with the outer stator base that are connected to the outer periphery of the actuator using the outer bonding frame,
   b) an image sensor attached to the load stage of the said microactuator, wherein the said image sensor is wire-bonded directly to the outside circuit board via movable wires,
   c) a circuit board attached to the top or bottom side of the said microactuator,
   d) optical lenses attached to the said housing,
   whereby the said microactuator displaces the image sensor along the in-plane axes x and y to achieve super resolution imaging and/or translates the image sensor along the optical axis (z) to achieve autofocus and/or tilts the image sensor about the x and y axes to correct for optical misalignment or dynamic tilt between the image sensor and the optical lenses.

18. The camera module of claim 17, wherein the wire-bonding signals of the image sensor are channeled through the microactuator structure.

* * * * *